United States Patent [19]

Harra

[11] 4,392,932

[45] Jul. 12, 1983

[54] METHOD FOR OBTAINING UNIFORM ETCH BY MODULATING BIAS ON EXTENSION MEMBER AROUND RADIO FREQUENCY ETCH TABLE

[75] Inventor: David J. Harra, Santa Cruz, Calif.

[73] Assignee: Varian Associates, Inc., Palo Alto, Calif.

[21] Appl. No.: 320,386

[22] Filed: Nov. 12, 1981

[51] Int. Cl.³ ............... C23C 15/00; C23F 1/00
[52] U.S. Cl. ............................. 204/192 E; 156/643; 204/298
[58] Field of Search ............ 204/192 E, 298; 156/345, 643

[56] References Cited

U.S. PATENT DOCUMENTS

3,730,873 5/1973 Pompei et al. ............ 204/298
4,333,814 6/1982 Küyel ........................ 204/298

Primary Examiner—Aaron Weisstuch
Attorney, Agent, or Firm—Stanley Z. Cole; Norman E. Reitz

[57] ABSTRACT

A method for etching a semiconductor wafer on an RF etch table employs a succession of different biases on an extension member positioned adjacent the periphery of the table. The extension member is electrically conductive, but is insulated from the etch table. The extension member is positioned with respect to the periphery of the table in a manner such that the plasma sheath induced above the etch table is continued beyond the periphery of the table, thereby eliminating the focusing of ions on the edges of an item being etched on the table. As different bias voltages are applied to the extension member, different etch profiles are experienced on the semiconductor wafer. The aggregation of etch profiles produces a more uniform overall etch.

8 Claims, 9 Drawing Figures

METHOD FOR OBTAINING UNIFORM ETCH BY MODULATING BIAS ON EXTENSION MEMBER AROUND RADIO FREQUENCY ETCH TABLE

DESCRIPTION

This invention relates to a method for obtaining a more uniform etch on a semiconductor wafer and, more particularly, relates to a radio frequency (RF) etch table having a biased member positioned adjacent its periphery whose bias is modulated to produce a more uniform rate of etch on a semiconductor wafer.

In the fabrication of semiconductor components, it is necessary at various points in the fabrication process to etch the surface of the wafer. These points include etching to clean a surface prior to the application of metallization or prior to carrying out an epitaxial growth step. And they include the delineation of a pattern in metallization or in an oxide by selecting etching of a layer partially covered with photoresist. The conventional approach has been to use chemical etchants. Increasingly, however, so-called dry etching techniques are used. These techniques include sputter etching, ion beam milling, and reactive ion etching. Sputter etching, sometimes called plasma etching, is well known in the art. See, for example, G. N. Jackson, "R. F. Sputtering", *Thin Solid Films*, v. 5, pp. 209, 236 et. seq. (1970) and R. Glang, et. al., "Generation of Patterns in Thin Films", *Handbook of Thin Film Technology*, pp. 7-49 (1970). The theory of operation of sputter etching is briefly stated as follows. The substrate is maintained at a high potential, either DC or RF, and a glow discharge plasma is induced above the surface of the substrate. The plasma consists of a mixture of electrons, ions and neutral atoms or molecules; the number of ions and electrons are almost equally balanced so that the net charge is near zero and movement of the ions is by diffusion rather than by drift in an impressed electric field. In the space immediately above the substrate and below the plasma there exists a region called the dark space in which no significant number of electrons are found. When position ions diffuse to the boundary between the dark space and the plasma, sometimes called the plasma sheath, they are no longer masked by the electrons and are extracted by the potential of a negatively charged substrate. They are drawn to the surface of the item placed on the etch table and strike it to thereby produce etching.

Uniform etching across the surface of a semiconductor wafer is becoming increasingly important in the fabrication of semiconductor devices. This is true as the level of integration increases and the minimum line width of lithographic features decreases. Small lithographic features could be destroyed in high etch regions while satisfactory etching would be experienced elsewhere on a semiconductor wafer. Consequently, it is often desirable and necessary to carry out etching to within a uniformity of plus or minus 10%. Etch uniformity has been attempted by the use of electrically floating shields, R. Mundt, et al., "Etch Uniformity in a $CCl_4$ Plasma Aluminum Etch", *Proceedings, Int'l. Electron Device Meeting*, 1980, p. 16.3; and by placement of the item to be etched in the center of a large etch table, R. S. Nowicki, "Properties of rf-sputtered $Al_2O_3$ films deposited by planar magnetron", *J. Vac. Sci. Tech.*, v. 14, No. 1, p. 127 (1977).

With RF sputter etching it is known that it is necessary to maintain a constant dark space height above the substrate in order to produce uniform etching. This condition must be met because the relative height of the plasma sheath will determine the number of ions extracted and the direction of their initial trajectories toward the substrate and thus will determine the uniformity of the etching rate. In addition, at the periphery of a substrate being etched the plasma sheath will curve down to meet the grounded structures surrounding the edge of the etch table. This produces a focusing effect since ions extracted from the plasma near the periphery of the etch table will have converging trajectories so that more ions will impinge on the outer edges of the substrate. Thus, in order to obtain uniform etch rates with RF etch tables it has been the practice to make the tables planar and much larger than the item being etched to avoid focusing effects around the periphery of the item being etched or to shape the surrounding ground electrode to produce termination of the plasma away from the edges of the semiconductor wafer.

In the copending application of Frederick Turner et al., "Radio Frequency Etch Table With Biased Extension Member", Ser. No. 320,385 filed on Nov. 12, 1981, a bias potential is applied to an extension member which is insulated from and surrounds an RF etch table. The plasma sheath above the etch table is thereby extended beyond its periphery so that more uniform etching is produced. An optimum bias potential is selected and maintained for the duration of etching. Since each potential possesses it own uniformity profile, this optimum potential will be that one which produces as uniform an etch as possible across the wafer. In making this selection a tradeoff may have to be made and a certain amount of non-uniformity accepted over limited areas of a semiconductor wafer. In general, it would be desirable to obtain better etch uniformity across the whole surface of a semiconductor wafer.

It is therefore an object of the present invention to provide a method of operating an RF etch table which permits a semiconductor wafer to be etched with improved uniformity across the whole surface of the wafer.

It is a further object of the present invention to provide an RF etch table having an extension member with an applied bias which is modulated and which is positioned around the periphery of the etch table to extend the boundary of the plasma sheath in a controlled and programmed manner.

It is another object of the present invention to operate an RF etch table having a peripheral extension member by applying known bias potentials in succession in order to maintain on the average a uniform dark space height above the etch table.

BRIEF DESCRIPTION OF THE DRAWINGS

For a more complete understanding of the present invention, reference may be had to the accompanying drawings which are incorporated herein by reference and in which.

SUMMARY OF THE INVENTION

An RF etch table is provided with a biased extension member adjacent its periphery. In operation, the bias is modulated so that selected voltages are applied in succession to the extension member. The extension member is electrically conductive, but is insulated from the etch table. The extension member is positioned with respect to the periphery of the table in a manner such that the plasma sheath induced above the etch table is continued beyond the periphery of the table, thereby eliminating the focusing of ions on the edges of an item being etched on the table. The succession of potentials impressed upon the extension member produce dark space regions above the extension member having heights such that the associated etching in the aggregate is more uniform.

DESCRIPTION OF THE PREFERRED EMBODIMENT

Etching in an RF plasma is carried out by the positive ions that are extracted from the plasma when the positive ions diffuse to the boundary between the dark space and the plasma region. The positive ions are attracted by the high negative bias on the substrate. If the substrate is planar, e.g., a semiconductor wafer, then the ideal configuration for the plasma sheath over the wafer would be a planar sheath larger than the substrate and coplanar with it. The ions would be generated as if from an infinite planar source and every point on the substrate would experience the same ion flux. In practicable systems, however, the sheath is curved at the edges due to the finite size of the etch table and the fact that structures surrounding the etch table are grounded. Consequently, a greater number of ions are extracted around the periphery and directed at the edges of the etch table in a manner such that their trajectories converge on the edges of the wafer being etched.

Various techniques and apparatus have been utilized to reduce non-uniformities in sputter etching. For example, as discussed in the section "Uniformity", in G. N. Jackson, "RF Sputtering", *Thin Solid Films*, v. 5, p. 290 at pp. 236–239 (1970), uniformity has been reported to be enhanced by varying the position of ground shielding and by applying magnetic fields. These approaches have not been found to produce the high uniformities, on the order of plus or minus 10%, that are now being sought in semiconductor fabrication. Another crude but effective approach is to make the etch table much larger than the item being etched, so that in the central region in which etching occurs, the flux of ions is essentially constant. In practicable systems, however, not enough space can be committed to nor cost allowed for the etch table to permit this solution to be adopted.

In the abovesaid copending application Ser. No. 320,385 of Frederick Turner et al., "Radio Frequency Etch Table With Biased Extension Member" filed on an even date herewith, the plasma sheath is extended by providing an electrically conductive extension member 20, shown in FIG. 5, which is positioned adjacent the periphery 9 of table structure 11 of etch table 10. By means of bias power supply 37 a bias potential is applied to member 20. Preferably, this is a DC potential, but it may be an RF potential providing it is isolated from the RF source of the etch table. The application of a bias potential serves to extend the plasma sheath beyond the periphery of the table structure to reduce the focusing of ions on the edges of the semiconductor wafer being etched. This produces improved uniformity.

Figure 5:
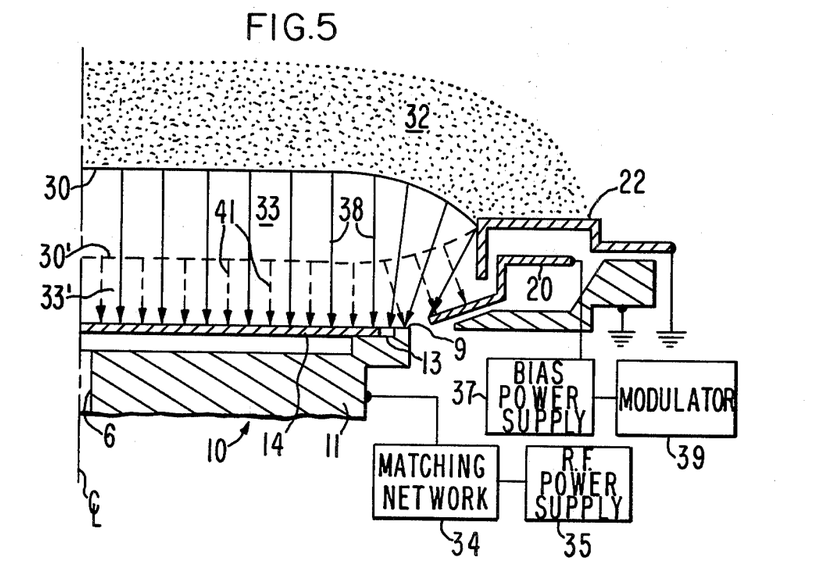
FIG. 5 is a schematic view of the plasma sheaths associated with two different biases produced by the modulator and bias power supply of the present invention.

When applying a single bias potential to extension member 20 it is necessary to choose the one which produces the best overall uniformity from the center to the edge of a semiconductor wafer. Generally, this is one which is sufficient to obtain the most horizontal configuration for the plasma sheath above the etch table. However, for any given bias voltage there will still be variations in etch rate across the wafer, particularly between the etch rate at the center and the etch rate at the periphery. Thus, for any given voltage, uniformity is specified to be within a certain range.

The apparatus and method of the present invention comprises the application of more than one bias voltage, in succession, to combine the characteristics of several etch profiles. The combination may be on a step function basis where the bias is alternately switched from one voltage to the other, or the bias may be gradually varied from one level to another. If alternated, the duty cycle can vary from less than a second to a significant fraction of the total etch time. Two or more discrete bias potentials or a continuously changing potential may be used. The latter is most feasible if active feedback of instantaneous etch rate is available.

Figure 7:
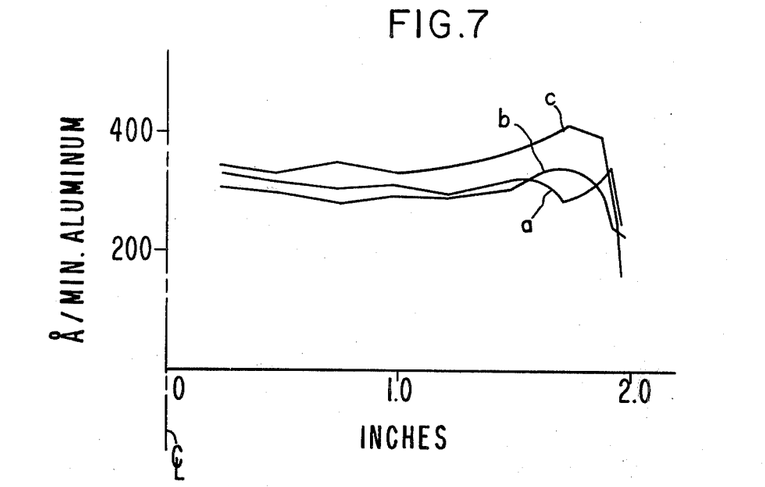
FIG. 7 is a graph showing etch rate in aluminum in the RF etch table of the present invention with the etch table being maintained at −200 volts and the bias on the extension member being modulated between −200 volts and −680 volts, between −310 volts and −400 volts, and between −300 volts and −760 volts.
Figure 8:
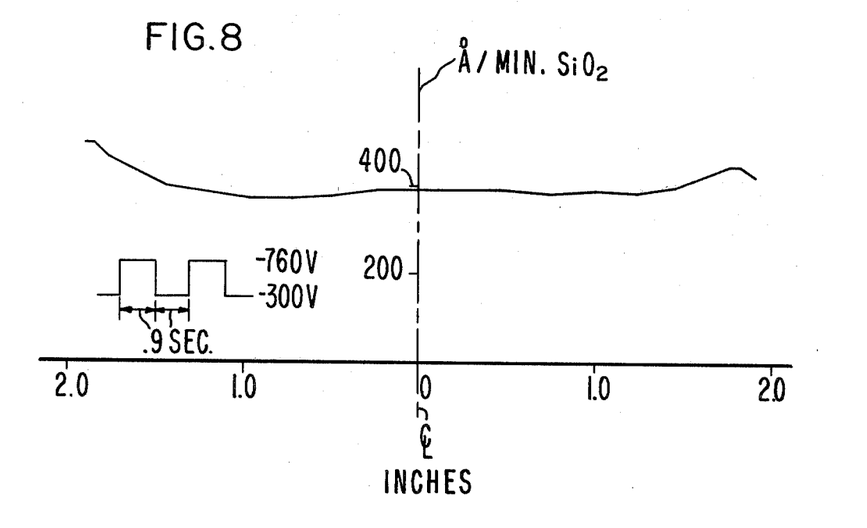
FIG. 8 is a graph showing etch rate on silicon dioxide placed on the RF etch table of the present invention with the etch table being maintained at −1200 volts and the bias of the extension member being modulated between −300 volts and −760 volts.

The method of the present invention produces uniform etch rates as shown in FIGS. 7 and 8. In FIG. 7 the table structure is maintained at −1200 volts and the extension member has a negative DC bias impressed upon it. An aluminum film on a 4-inch silicon wafer is etched. The negative DC bias is recycled to −200 volts for 0.31 sec and to −680 volts for 1.3 sec. Uniformity is about ±10%. In curve b the negative DC bias is cycled to −300 volts for 0.9 sec and to −400 volts for 0.9 sec. Uniformity is +23% and −50%. It is notably poor probably because close voltages are chosen and there is no real combining of etch rate curve characteristics. In curve c the negative DC bias is cycled to −300 volts for 0.9 sec and to −760 volts for 0.9 seconds. Uniformity of +16% and −24% is obtained. Modulation schemes of all types may be selected to optimize uniformity for given materials, topography and for etch rate regimes. As shown in FIG. 8, a layer of SiO$_2$ on a 4-inch silicon wafer was etched at a rate of about 400 A°/minute with the extension member alternately biased at −760 volts and −300 volts; duty cycles in each case were 0.9 sec.

Figure 9:
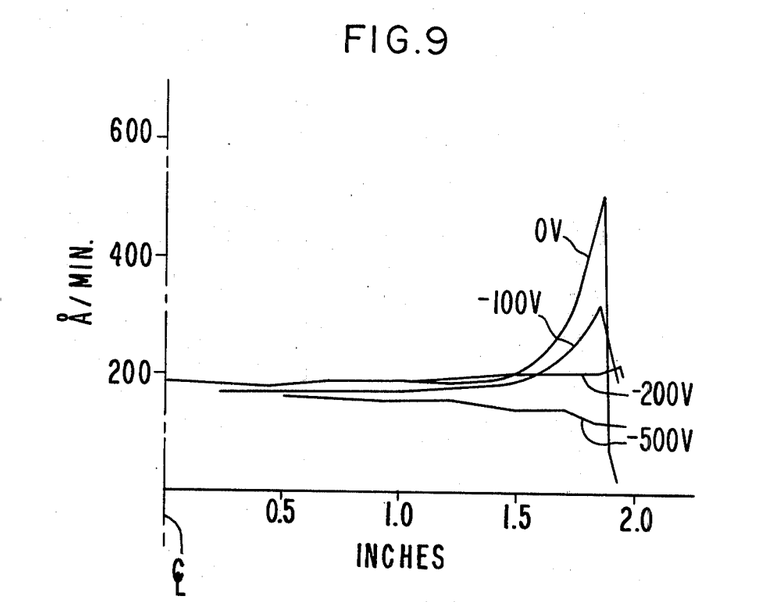
FIG. 9 is a graph showing etch profiles in aluminum for a number of extension member voltages.

The present invention is possible because the etch characteristics, especially at the periphery, include both overetching and underetching. These opposing characteristics are combined to obtain improved overall uniformity. As seen in FIG. 9 with no applied bias, the etching at the periphery of the wafer is more than twice the rate on the center of the wafer. With an applied bias of −100 volts, the peripheral etching is reduced to about one and one-half times central etching. With an applied bias of −200 volts, the peripheral etching is slightly higher. With an applied bias of −500 volts, peripheral etching appears to be less than etching in the center by about 40-50 percent. These results are fairly interpreted as showing the shifting of the plasma sheath above the periphery of the etch table from a level below the level at the center to a level above the level at the center. By combining etch profiles that have opposite characteristics, improved uniformity can be obtained.

Figure 4:
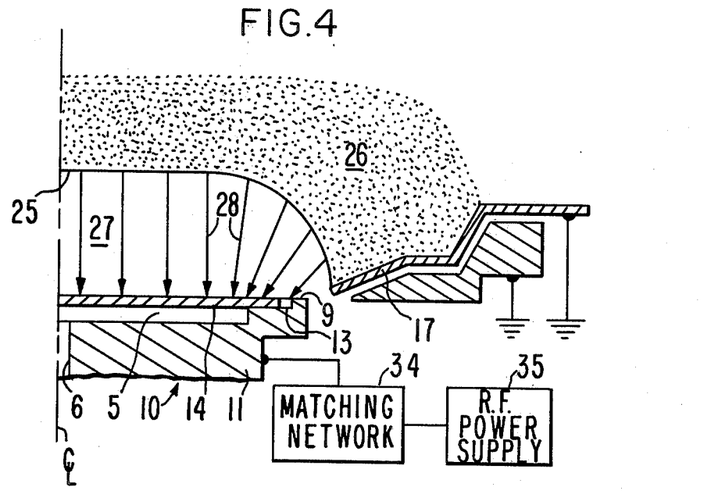
FIG. 4 is a schematic view of the plasma sheath over a conventional etch table.
Figure 6:
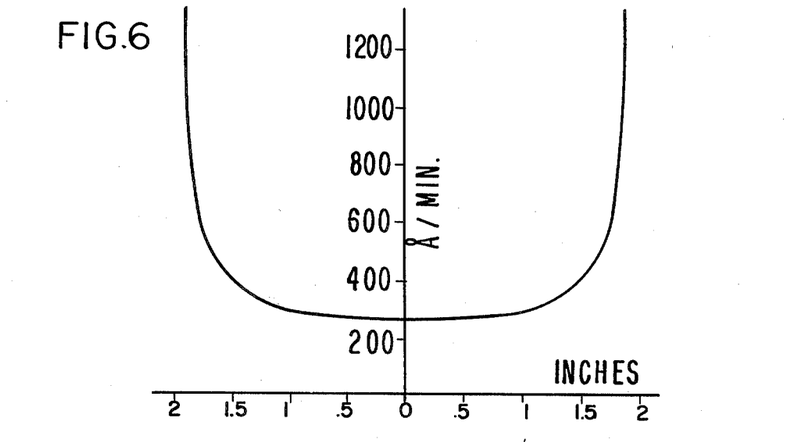
FIG. 6 is a graph showing etch rate in A°/minute in aluminum placed on a conventional etch table.

Insight into the method of the present invention may be gained by comparing FIGS. 4 and 5. The conventional etch table of the prior art shown schematically in FIG. 4, comprises a table 10 having a base structure 11 and a circumferential lip 13 on which a semiconductor wafer 14 rests. Wafer 14 lies above open region 5 to permit gas conduction cooling when a gas is introduced through central conduit 6, an important feature due to the high power densities experienced in sputter etching. Table structure 11 is maintained at a high RF potential on the order of kilovolts by being capacitively coupled through matching network 34 to RF power supply. A plasma 26 is generated above etch table 10 and is separated from semiconductor wafer 14 by dark space region 27. Ions are extracted across plasma sheath 25, the boundary between plasma 26 and dark space region 27, and travel along trajectories 28 to reach the surface of wafer 14. In the prior art, structural member 17, which surrounds periphery 9 of etch table 10, is maintained at machine potential, which is typically ground potential. The dark space disappears beyond the edge of etch table 10 and plasma sheath 25 curves down to meet structural member 17. As a consequence, more ions are produced near the edge of the etch table and etch rates are much higher near the edge than in the center. For example, FIG. 6 shows the etch rate in A°/minute on an aluminum film on a semiconductor wafer placed on a conventional etch table in an argon plasma. The etch rate is more than five times greater at the periphery than in the center.

The schematic illustration of FIG. 5 shows the extended plasma sheaths 30 and 30′ associated with the cycled bias voltages of the present invention. The sheath 30 forms the boundary between plasma region 32 and dark space region 33. The sheath 30′ forms the boundary between an extended plasma region 32′ (not shown) and a reduced dark space region 33′. As with conventional RF etch tables semiconductor wafer 14 rests on lip 13 of base 11 and table 10 is connected through matching network 34 to RF power supply 35. Gas conduction cooling is accomplished through open region 5 when gas is introduced through central conduit 6. Shield 22 protects the insulator on which extension member 20 is mounted from becoming coated with material sputtered from extension member 20 by ions extracted from the plasma 32 and therefore conductive. With the apparatus of the present invention, plasma sheaths 30 and 30′ are extended due to the presence of an electrically conductive extension member 20 which is positioned adjacent the periphery 9 of etch table 10. The extension of plasma sheath 30 is a curve downwards to shield 22 whereas the extension of plasma sheath 30′ is a curve upwards to shield 22. Both sheaths 30 and 30′ are improvements over the prior art sheath 25 of FIG. 4. However, when the etch profiles associated with these two sheaths are combined as with the method of the present invention, a composite etch profile is obtained. This composite etch profile is obtained by etching produced by ions having the trajectories 38 and by ions having the trajectories 41. This composite etch profile is nearly horizontal even at the edges of the semiconductor wafer. In operation, bias power supply 37 applies the various biases to extension member 20. It has been found that a bias must be applied to extend the plasma sheath since a grounded member draws the plasma sheath down and a floating electrode assumes a potential far different than required to maintain a horizontal plasma sheath. Extension member 20 is attached to external support members (not shown) and is electrically isolated from the machine, from ground and from etch table 10. Preferably, the bias potential applied to extension member 20 is a DC potential. An RF bias potential may be used, but should be isolated from the RF source of the etch table in order to not draw power away from the table. Typically, bias power supply 37 will supply a DC voltage in the range of −100 volts to −1000 volts and the various biases will be selected from values within this range. The actual value of the potential will depend upon the position of the extension member above the surface of the etch table and the etch profile characteristic sought.

The position of the extension member with respect to the edge of the etch table is determined in accordance with the following considerations. The extension member must be placed laterally close to the edge of the etch table so that the plasma does not have significant line of sight exposure to a grounded member until beyond the periphery of the etch table. If such exposure were provided, then the plasma sheath would not be a horizontal extension of the sheath above the etch table, but would experience a dip in this region. The height of the extension member may vary from a position beneath the level of the etch table to a position above the level of the etch table. From Vossen, *Thin Film Processing*, p. 85, (1978), it is known that the current density from an RF plasma is given by $$J = 27.3 \left(\frac{40}{M}\right)^{\frac{1}{2}} \frac{V^{3/2}}{d^2}$$

where
d = dark space height (in mm)
V = voltage on etch table (in kv)
M = molecular weight of sputtering atom
J = current density in ma/cm²

This can be converted to a value for the height of the dark space in terms of the voltage on a conductive surface and the ion current:

$$d = \left(27.3 \left[\frac{40}{M}\right]^{\frac{1}{2}} \frac{V^{3/2}}{J}\right)^{\frac{1}{2}}$$

This formula can also be used to estimate the height of the dark space above the extension member for a number of extension member voltages and associated currents obtained in conjunction with a pressure of 6×10⁻³ Torr:

| V | I(ma) | J(ma/cm$^2$) | Dark Space Height | |
| | | | (mm) | (inches) |
| --- | --- | --- | --- | --- |
| −760 | 17 | 0.73 | 4.9 | 0.196 |
| −680 | — | — | 4.57 | 0.180 |
| −600 | 17 | 0.73 | 4.16 | 0.164 |
| −400 | 12 | 0.52 | 3.64 | 0.143 |
| −200 | 12 | 0.52 | 2.38 | 0.093 |
| −100 | 10 | 0.43 | 1.41 | 0.056 |

The dark space height and thus the position of the plasma sheath above the extension member is a function of the applied bias voltage. For a given value for the applied bias the position of the plasma sheath rises if the extension member is raised and the position of the plasma sheath is lowered if the extension member is lowered. For an extension member held in a fixed position, the position of the plasma sheath rises if the applied bias voltage is increased and the position of the plasma sheath is lowered if the applied bias voltage is reduced. In the preferred apparatus employed by the method of the present invention, the extension member is elevated above the horizontal level of the etch table in order to permit a lesser voltage to be applied to the extension member and yet obtain a horizontal extension of the plasma sheath beyond the edge of the etch table. It has been found that the position of the extension member above the etch table should not be so high that grounded structures around the periphery of the etch table is not exposed to the plasma, yet not so low or close to the edge of the etch table that incidental sputtering of the extension member produces metal impurities which contaminate the surface of the semiconductor wafer being etched. For a typical RF etch table bias of −2000 volts the position of the bias ring above the etch table will range from about 2 to about 4 mm and the applied bias voltage will be modulated within the range from about −200 volts to about −800 volts. Thus, the extension member is maintained in the range of 0.1 to 0.4 times the potential of the table structure.

Figure 1:
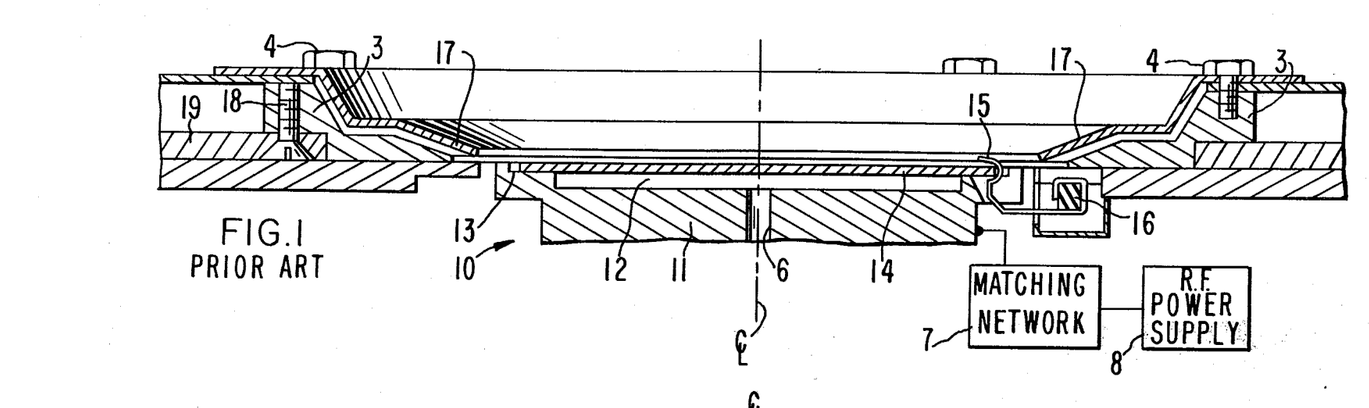
FIG. 1 is a cross-sectional view of a conventional RF etch table.

An etch table of the prior art is shown in cross-section in FIG. 1. A table 10 of generally circular shape comprises a base structure 11 configured with a wafer receiving lip 13 and a gas cooling void 12. When a wafer 14 is in position to be etched by a plasma (not shown), conductive cooling of the wafer is accomplished by a gas introduced through channel 6 to void 12; this cooling is accomplished, for example, in the manner set out in M. King, "Method for Conducting Heat to or From an Article Being Treated Under Vacuum", U.S. Pat. No. 4,261,762. Table structure 11 is maintained at a high RF potential by being capacitively coupled through matching network 7 to RF power supply 8. Wafers are held in place by clips 15 which are attached to insulated post 16, for example, in the manner set out in copending application of R. Shaw, "Wafer Support Assembly", application Ser. No. 106,179, filed Dec. 21, 1979, now U.S. Pat. No. 4,306,731. The etch table 10 is surrounded by a structural member 17 such as a pressure plate or a grounded shield. Structural member 17 is affixed by screws 4 to structural member 3 which is affixed to machine support 19 by screw 18. Thus, structural member 17, which is the closest physical entity above and adjacent the etch table, is maintained at machine potential which is typically ground potential. In operation, the plasma generated above etch table 10, and thus above semiconductor wafer 14, is constrained to the region immediately above the table and wafer since a high voltage is required to induce and sustain the plasma. The machine potential of the surrounding structure is not sufficient to induce and sustain a plasma so the plasma sheath reaches down and terminates on the grounded structure.

Figure 2:
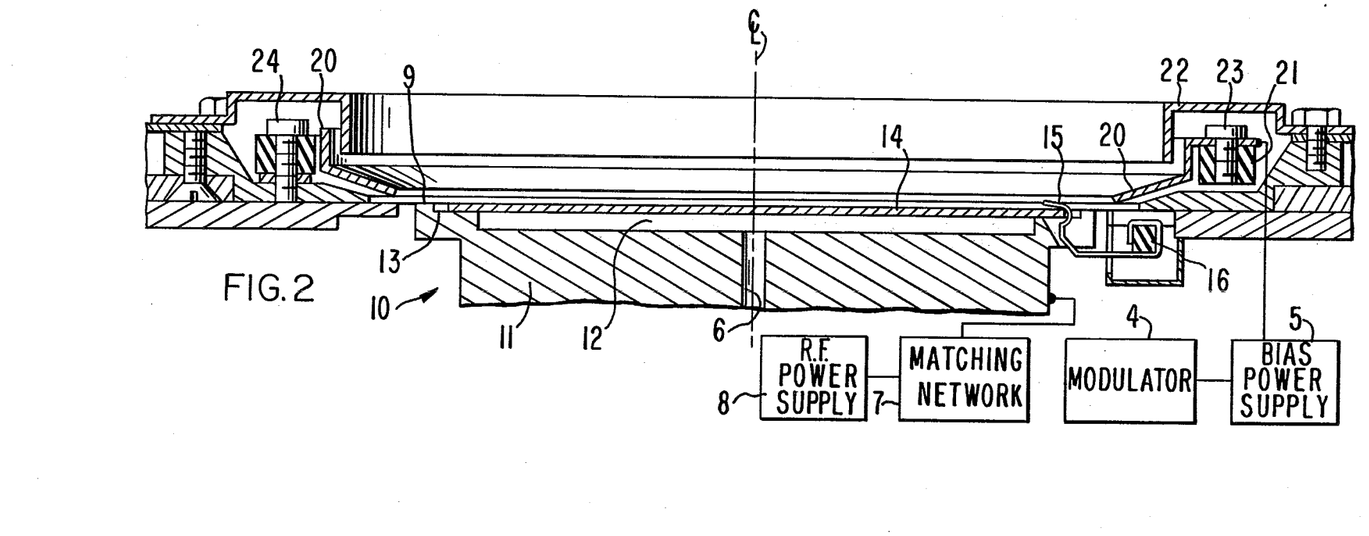
FIG. 2 is a cross-sectional view of the RF etch table of the present invention illustrating the bias power supply and associated modulator.
Figure 3:
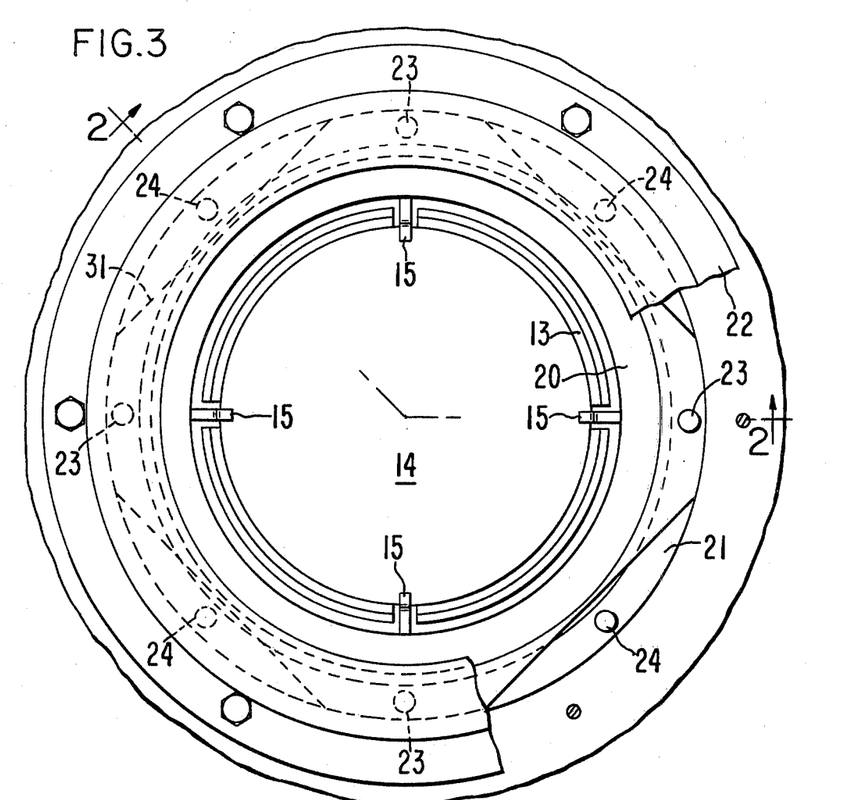
FIG. 3 is a plan view of the RF etch table of FIG. 2.

An etch table on which the method of the present invention may be practiced is shown in FIGS. 2 and 3. In common with the prior art etch table, a high RF voltage is applied to table structure 11 of table 10, a high RF voltage is applied to table 10 by RF power supply 8 through matching network 7. Clips 15 are attached to insulated post 16 and hold semiconductor wafer 14 in place on receiving lip 13. Distinct from the prior art, however, the structural member closest to the edge of the etch table, extension member 20, is electrically insulated from the machine by ceramic insert 21. Therefore, the potential on extension member 20, and thus the potential condition in the region just beyond the periphery of the etch table, is determined by the voltage applied by bias power supply 5. Modulator 4 controls both the setting of bias power supply 5 for the duration of the etch. It comprises a standard timing and control network and is not described in detail. In operation, in accordance with the method of the present invention, the potential on extension member 20 is maintained substantially below ground or machine level, but not as negative as the level of the table structure 11. The potentials which are applied successively are preferably in the range of 0.1 to 0.4 times the self bias potential of the etch table, while the extension member is preferably positioned about 2–4 mm above the level of the etch table. Etch rate profiles having opposite characteristics are combined by cycling between different voltages on the extension member. The selection of profiles is made in order to obtain increased uniformity in the aggregate.

What is claimed is:

1. A method for obtaining a uniform etch on a semiconductor wafer being etched on an RF etch table in a plasma etch system, comprising, placing said semiconductor wafer on said RF etch table, said table having an extension member positioned adjacent its periphery, said extension member being electrically conductive and being insulated from the structures surrounding said table, generating a plasma above said etch table to thereby etch the surface of said wafer, protecting the surface of said extension member from ions extracted from said plasma to prevent the generation of unwanted metallic impurities, applying a bias potential to said extension member whereby the sheath of said plasma generated above said etch table is extended beyond the periphery of said etch table and above at least a portion of said extension member, and modulating said bias potential so as to produce a more uniform overall etch on said semiconductor wafer.

2. A method of obtaining a uniform etch in accordance with claim 1 wherein said step of applying a bias potential is accomplished by the step of applying a DC bias potential.

3. A method for obtaining a uniform etch in accordance with claim 1 wherein said step of generating a plasma is accomplished by the steps of introducing a sputtering gas above said etch table and impressing an RF voltage on said etch table.

4. A method for obtaining a uniform etch in accordance with claim 3 wherein said step of modulating said bias potential is accomplished by the step of modulating said bias potential within the range of 0.1 to 0.4 times the self bias potential of said etch table.

5. A method for obtaining a uniform etch in accordance with claim 4 wherein said step of modulating said bias potential is accomplished by the step of switching said bias voltage among a series of discrete voltages.

6. A method for obtaining a uniform etch in accordance with claim 5 wherein said step of switching said bias voltage among a series of discrete voltage is accomplished by the step of switching said bias voltage between two discrete voltages.

7. A method for obtaining a uniform etch in accordance with claim 4 wherein said step of modulating said bias voltage is accomplished by the step of applying a continuously changing voltage to said extension member.

8. A method for obtaining a uniform etch in accordance with claim 4 wherein said step of modulating said bias potential within the range of 0.1 to 0.4 times said self bias potential of said etch table is accomplished by the step of modulating said bias potential within the range of 0.2 to 0.3 times said self bias potential of said etch table.

* * * * *